(12) United States Patent
Li

(10) Patent No.: US 6,396,430 B1
(45) Date of Patent: May 28, 2002

(54) PRE-AMPLIFIER DESIGN FOR HIGH-SPEED ANALOG-TO-DIGITAL CONVERTERS

(75) Inventor: Qunying Li, Somerset, NJ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/929,759

(22) Filed: Aug. 14, 2001

(51) Int. Cl.$^7$ ................................................ H03M 1/10
(52) U.S. Cl. ......................... 341/155; 341/120; 327/77
(58) Field of Search ................................ 341/155, 144, 341/145, 156, 150, 115, 118, 158, 161, 169, 170, 172; 327/82, 74, 77, 76

(56) References Cited

U.S. PATENT DOCUMENTS

| | | | |
|---|---|---|---|
| 5,821,780 A | * 10/1998 | Hasegawa | 327/63 |
| 5,936,434 A | * 8/1999 | Kumamoto et al. | 327/77 |
| 5,990,814 A | * 11/1999 | Croman et al. | 341/118 |
| 6,084,538 A | * 7/2000 | Kostelnik et al. | 341/120 |
| 6,204,980 B1 | 3/2001 | Momtaz et al. | |

* cited by examiner

*Primary Examiner*—Brian Young
*Assistant Examiner*—John Nguyen
(74) *Attorney, Agent, or Firm*—W. Daniel Swayze, Jr.; W. James Brady; Frederick J. Telecky, Jr.

(57) ABSTRACT

The present invention overcomes the gate leakage drawback existing in advanced CMOS technologies to achieve extremely high-speed analog-to-digital conversion. The circuit and method employ an input offset storage (IOS) technique to calibrate the differential comparator device during an auto-zero cycle. The reference voltage and offset voltages are stored on capacitors coupled to the inputs of the differential comparator device during the auto-zero cycle. A source follower is placed between each capacitor and the inputs to the differential comparator device. The source followers are selected to prevent leakage from the capacitors during a conversion mode. Additionally, switches utilized in feedback loops for auto-zeroing the differential comparator are also selected to prevent leakage of the capacitors in the conversion mode.

26 Claims, 4 Drawing Sheets

PRE-AMPLIFIER DESIGN FOR HIGH-SPEED ANALOG-TO-DIGITAL CONVERTERS

TECHNICAL FIELD

The present invention relates to electrical circuits, and more particularly to a circuit and method for providing an improved pre-amplifier scheme for high speed analog-to-digital converters.

BACKGROUND OF THE INVENTION

The non-ideal characteristics in data conversion interfaces become more apparent for devices that are designed for high precision in contrast to lower precision devices. Mismatch, nonlinearity and finite intrinsic gain are some of the effects that limit resolution of CMOS and bipolar technology in analog-to-digital conversion (ADC) devices. It is common to correct these effects by employing circuit and/or algorithmic techniques. These techniques can be utilized on individual components in addition to the overall architecture of the device to provide input/output characteristics that approach an ideal. Circuits and algorithms employing these techniques conventionally require a dedicated period for cancellation or calibration, thus, complicating the timing scheme of the overall system.

A number of methods currently exist to enhance the precision or relax speed-precision trade-offs of data acquisition systems, such as comparator and operational amplifier offset cancellation, DAC and ADC calibration, and range overlap with digital correction. Offset cancellation in high-precision systems are crucial in CMOS devices because of the large mismatches of CMOS devices. Offset cancellation is also important in bipolar and BiCMOS devices for resolutions above 10 bits. The need for reliable offset cancellation has led to auto-zero techniques in CMOS and BiCMOS comparators, where the offset is periodically sensed, stored and added to the input in such a way as to cancel the offset. The purpose is to minimize the input offset contributed by the pre-amplifier and the latch without compromising other aspects of the performance of the device.

FIG. 1 illustrates a prior art fully-differential comparator device 10 conventionally employed in high speed ADC designs. The comparator device includes a pre-amplifier 12 with a negative input terminal, a positive input terminal, a positive output terminal and a negative output terminal. A first feedback loop 15 couples the negative input terminal to the positive output terminal and a second feedback loop 17 couples the positive input terminal to the negative output terminal. A first capacitor 26 is coupled to the negative input terminal of the pre-amplifier 12 on a right side and a pair of switches 20 and 22 on a left side. A second capacitor 32 is coupled to the positive input terminal of the pre-amplifier 12 on a right side and a pair of switches 28 and 30 on a left side. The switch 20 is coupled to a first voltage input signal ($V_{IN+}$) and the switch 28 is coupled to a second voltage input signal ($V_{IN-}$). The switch 22 is coupled to a first voltage reference signal ($V_{REF+}$) and the switch 30 is coupled to a second voltage reference signal ($V_{REF-}$). The pre-amplifier 12 is followed by a latch 14.

During an auto-zero cycle (e.g., typically, 50 ns–100 ns), the reference voltages $V_{REF+}$ and $V_{REF-}$ are connected to the left sides of the capacitors 26 and 32, respectively, while the feedback loops 15 and 17 are connected around the pre-amplifier 12 by closing switches 22, 30, 16 and 18. The voltage stored on the capacitors 26 and 32 are equal to the respective reference voltages minus the pre-amplifier's common-mode voltage. During the conversion cycles (e.g., typically 100 μs–400 μs), the feedback loops 15 and 17 around the pre-amplifier 12 are opened, and the left sides of the capacitors 26 and 32 are connected to the comparator input signals ($V_{IN+}$, $V_{IN-}$) instead of the reference signals ($V_{REF+}$, $V_{REF-}$). The input node of the pre-amplifier 12 receives the input signal subtracted by the reference voltage. Then the input signal of the pre-amplifier 12 is amplified and fed to the latch 14. The above scheme also cancels the offset of the pre-amplifier 12, since the offset voltage is pre-stored on the capacitors 26 and 32 during the auto-zero cycle, and is cancelled during the conversion cycle. Therefore the key of this method is that the reference voltage and the offset voltage ($V_{REF}+V_{OFFSET}$) held on the capacitors 26 and 32 must not be changed during the conversion cycle.

However, there is a problem of $V_{REF}+V_{OFFSET}$ leakage from the capacitors 26 and 32, which makes the conventional scheme in FIG. 1 not work properly for all device types. For extremely high speed ADC operation (e.g., 1.28 GSample/s), high-speed devices have to be used as the input device of the pre-amplifier 12. The high-speed device has a reduced feature size, particularly its gate oxide layer thickness and thus it can only withstand a lower gate voltage. However, these devices typically experience gate current leakage during the conversion cycle causing leakage in the storage capacitors 26 and 32. The leakage in the storage capacitors 26 and 32 causes attenuation of the offset voltage of the pre-amplifier 12 and the reference voltage, resulting in unacceptable readings for high resolution ADCs.

In view of the above, it is apparent that there is an unmet need for improvements in the above differential comparator device for high speed ADCs.

SUMMARY OF THE INVENTION

The present invention overcomes the gate leakage drawback existing in advanced CMOS technologies to achieve extremely high-speed analog-to-digital conversion. A circuit and a method is provided that facilitates for improved performance of a differential comparator device for a very high-speed analog-to-digital converter device. The present invention employs an input offset storage (IOS) technique to compensate for an offset voltage of a pre-amplifier device in the differential comparator device. A reference voltage and an offset voltage are stored on capacitors coupled to the inputs of the differential comparator device during an auto-zero cycle. A source follower is placed between each capacitor and the inputs to the pre-amplifier device. The source followers are selected to prevent leakage of the capacitors during a conversion mode. Additionally, switches utilized in feedback loops for auto-zeroing the differential comparator are also selected to prevent leakage of the storage capacitors in the conversion mode.

In one aspect of the invention, high-speed devices (e.g., 1.2 volt devices) are utilized in the differential pre-amplifier device. Additionally, an n-type source follower which employs a 3.3 volt device is placed between each capacitor and the inputs to the pre-amplifier device. The 3.3 volt device used in the n-type source followers have substantially no gate to source leakage current. The switches utilized in the feedback loops are also selected to be 3.3 volt NMOS devices due to the fact that they have substantially no leakage that would cause reduction of the offset voltage and the reference voltages stored on the storage capacitors during the auto-zero mode. Since there is a DC level shift caused by the 3.3 volt n-type source followers, a p-type source follower is placed in each of the feedback loops to compensate for the DC level shift, and to assure that the input signal into the pre-amplifier device remains below a 1.2 volt swing.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed and the present invention is intended to include all such embodiments and their equivalents. Other objects, advantages and novel features of the invention will become apparent from the following detailed description of the invention, when considered in conjunction with the drawings.

DETAILED DESCRIPTION OF THE INVENTION

The present invention will now be described with respect to the accompanying drawings in which like numbered elements represent like parts. The present invention will be described with reference to a circuit and a method of providing a fully-differential comparator device for a high speed analog-to-digital converter device. To achieve an extremely high-speed analog-to-digital converter (e.g., 1.28 GSample/s), the latest advanced CMOS technology is used. The advanced CMOS technology usually provides high-speed devices and relative low-speed devices. The high-speed devices are obtained by substantially scaling down the size of the devices (e.g., a minimum channel length of about 0.15 micron). Because of the extremely thin oxide layer (e.g., about $24 \times 10^{-10}$ m) between the gate and the channel of such a scaled down device, the high-speed devices demonstrate gate-to-source and gate-to-drain current leakage and such devices can only withstand a low gate voltage (e.g., about 1.2 volts). In contrast with a high-speed device, a low-speed device has a relatively large size (e.g., a minimum channel length of about 0.5 micron) and a relatively thick oxide layer (e.g., about $70 \times 10^{-10}$ m). Such a low-speed device has substantially no gate leakage and it can withstand a high gate voltage (e.g., about 3.3 volts).

The present invention employs an input offset storage (IOS) technique to calibrate a pre-amplifier device of the differential comparator device during an auto-zero cycle. Specifically, during an auto-zero cycle, the reference voltage and offset voltages are stored on storage capacitors coupled to the inputs of the pre-amplifier device. The voltage stored on the capacitors during the auto-zero cycle is not changed during the conversion cycle. When an extremely high conversion speed (e.g., 1.28 GSample/s) is required, high-speed devices are used as the input transistors in the pre-amplifier. However, the high-speed devices demonstrate gate-to-source and gate-to-drain current leakage, which attenuate the reference voltage and the offset voltage pre-stored in the capacitors. To prevent such current leakage, two n-type source followers are placed between the capacitors and the input nodes of the pre-amplifier, as shown and will be described in conjunction with FIG. 2. The devices used in the source followers are low-speed devices which have substantially no gate current. Meanwhile, the speed of the entire comparator is not reduced due to the source follower configuration.

Additionally, switches utilized in feedback loops for an auto-zeroing of the differential comparator are also selected to prevent leakage of the storage capacitors in a conversion mode. It should be understood that the description below is merely illustrative and should not be construed in a limiting sense.

Figure 1:
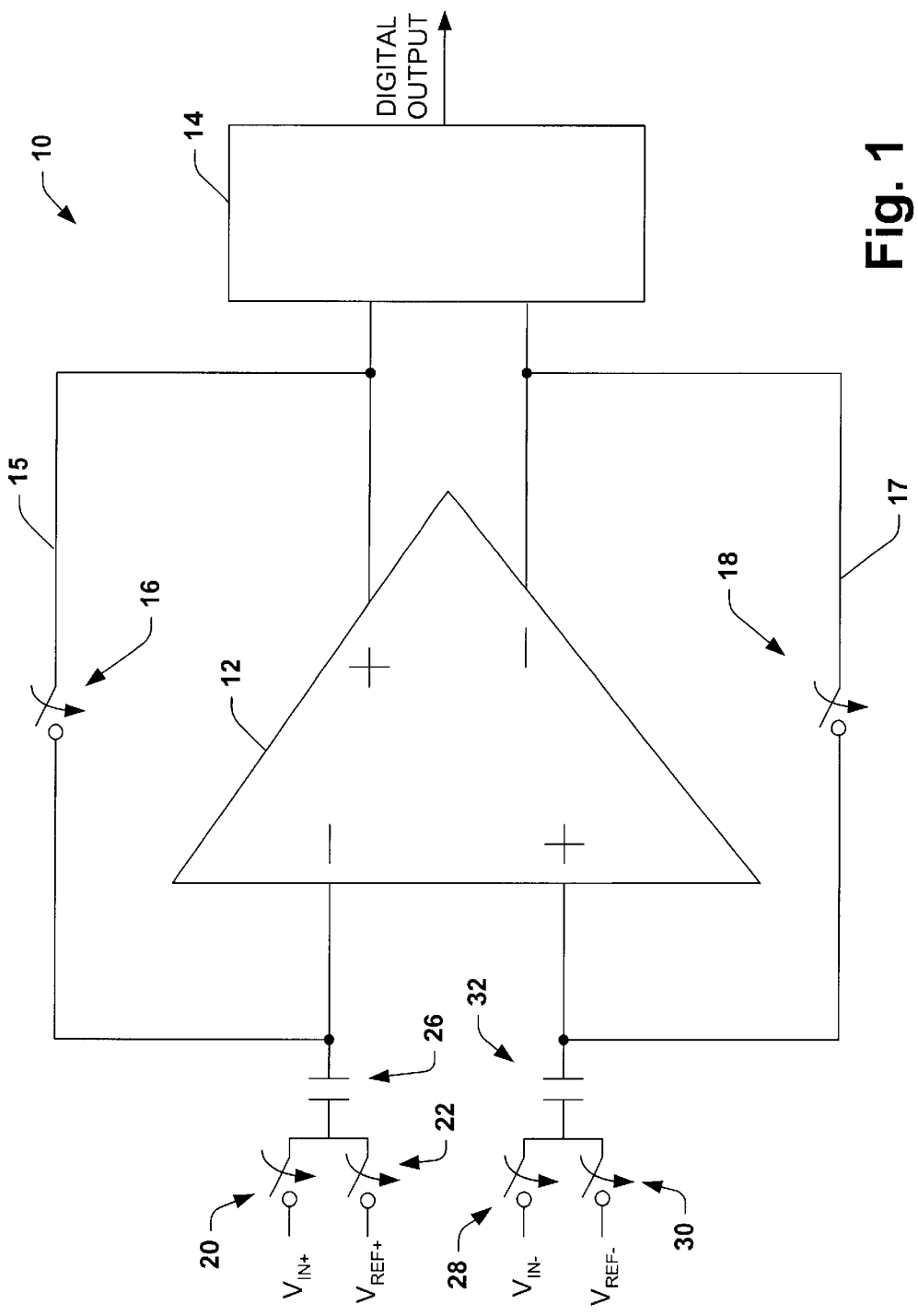
FIG. 1 illustrates a schematic diagram of a differential comparator device for a high-speed analog-to-digital converter in accordance with the prior art.
Figure 2:
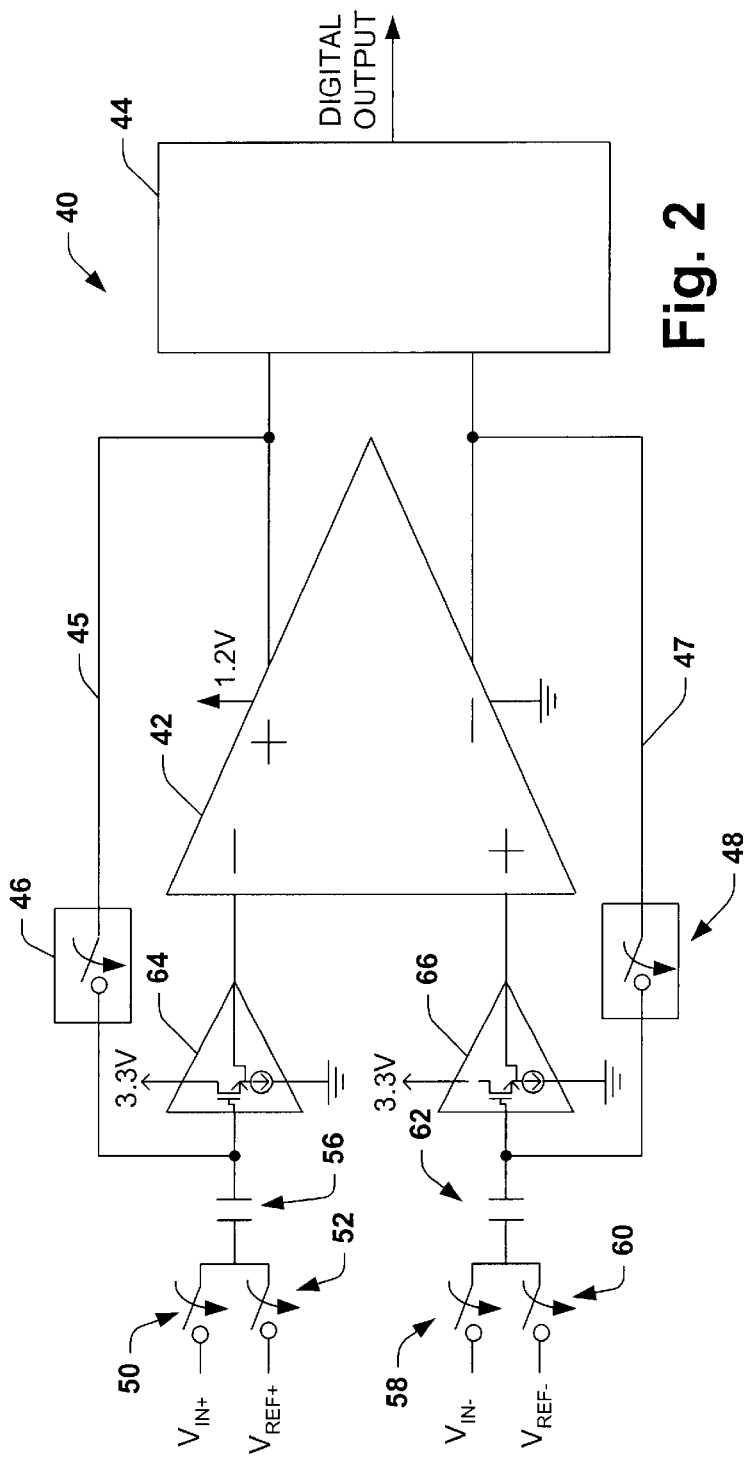
FIG. 2 illustrates a schematic diagram of a differential comparator device for a very high-speed analog-to-digital converter in accordance with one aspect of the present invention.

FIG. 2 illustrates a fully-differential comparator device 40 employed in high speed ADC designs according to one aspect of the present invention. The comparator device 40 includes a pre-amplifier 42 with a negative input terminal, a positive input terminal, a positive output terminal, and a negative output terminal. The pre-amplifier 42 is designed to provide high speed data conversion (e.g., 1.28 GSample/s). A first feedback loop 45 couples the negative input terminal to the positive output terminal of the pre-amplifier 42 and a second feedback loop 47 couples the positive input terminal to the negative output terminal of the pre-amplifier 42.

A first capacitor 56 is coupled to a pair of switches 50 and 52 on a left side, and to the negative input terminal on a right side through a first buffer device 64 (e.g., a first source follower device). A second capacitor 62 is coupled to a pair of switches 58 and 60 on a left side, and to the positive input terminal on a right side through a second buffer device 66 (e.g., a second source follower device). The first and second buffers are selected to have substantially no leakage to prevent discharge of the first capacitor and the second capacitor after an auto-zero cycle. The switch 50 is coupled to a first voltage input signal ($V_{IN+}$) and the switch 58 is coupled to a second voltage input signal ($V_{IN-}$). The switch 52 is coupled to a first voltage reference signal ($V_{REF+}$) and the switch 60 is coupled to a second voltage reference signal ($V_{REF-}$). The pre-amplifier 42 is followed by a latch device 44, which provides a digital output of the sampled analog output difference signal of the pre-amplifier 42.

Figure 3:
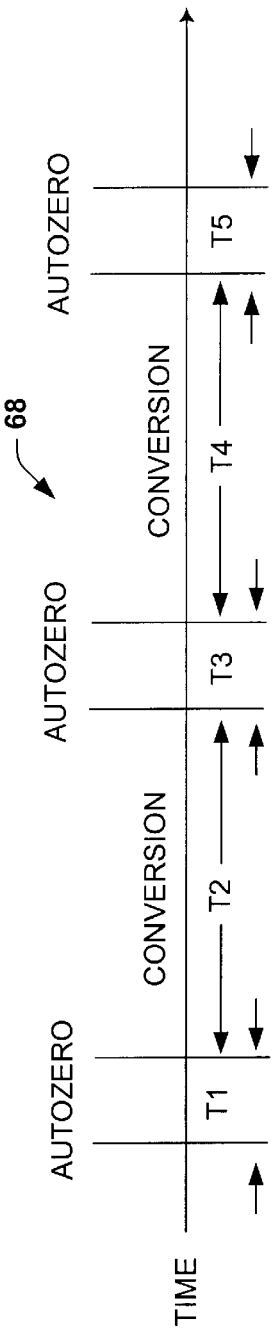
FIG. 3 illustrates a graph of auto-zero cycles and conversion cycles over time in accordance with one aspect of the present invention.

FIG. 3 illustrates an example of a graph 68 of auto-zero cycles and conversion cycles over time. As illustrated in the graph 68, an auto-zero cycle occurs over a time period T1 (e.g., 100 ns) followed by a conversion cycle over a time period T2 (e.g., 100 µs). These cycles repeat over time, for example, another auto-zero cycle over a time period T3 followed by a conversion cycle over a time period T4 followed by an auto-zero cycle of T5 and so on. During an auto-zero cycle, the reference voltages $V_{REF+}$ and $V_{REF-}$, which can be produced by a resistor ladder, are connected to the left side of the capacitors 56 and 62, respectively, while the feedback loops 45 and 47 are connected around the pre-amplifier 42 by closing switches 52, 60, 46 and 48, as can be seen in FIG. 2. A first switch 46 and a second switch 48 are selected to have substantially no leakage (e.g., by using a MOS transistor configuration which exhibits substantially no gate leakage). The switches 46 and 48 are selected to prevent leakage current, so that the voltage stored on the capacitors 56 and 62 do not change during the conversion cycle due to capacitor discharge. Since the switches 46 and 48 are only used to connect/disconnect the feedback loops 45 and 47, their operation may be slower than the pre-amplifier 42, and thus do not affect the speed of the A/D converter.

After settling down in the auto-zero cycle, the voltages stored on the capacitors 56 and 62 are equal to the reference voltage minus the pre-amplifier's common mode voltage. During the conversion cycles (e.g., typically 100 μs–400 μs), the feedback loops 45 and 47 around the pre-amplifier 42 are opened via switches 46 and 48, and the left side of the capacitors 56 and 62 are connected to the comparator inputs ($V_{IN+}$, $V_{IN-}$) instead of the reference signals ($V_{REF+}$, $V_{REF-}$). The differential inputs of the pre-amplifier 42 receive the input signal subtracted by the reference voltage through the first and second buffers 64 and 66. The input signal of the pre-amplifier 42 is then amplified and the output of the pre-amplifier 42 fed to the latch 44. During the conversion cycle, the latch 44 provides the digital output words corresponding to the analog output difference signal of the pre-amplifier 42.

Figure 4:
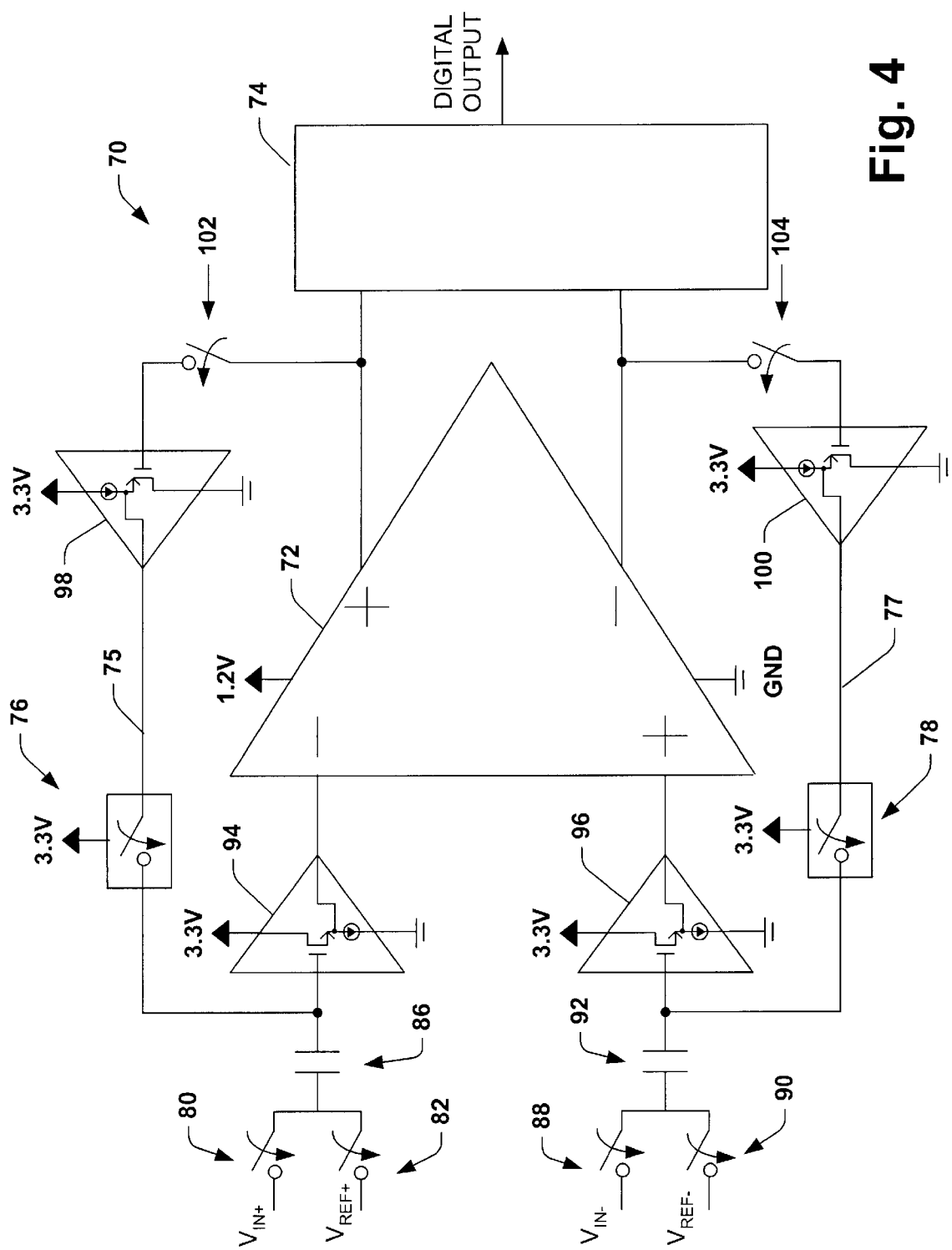
FIG. 4 illustrates a schematic diagram of a differential comparator device for a very high-speed analog-to-digital converter in accordance with another aspect of the present invention.

FIG. 4 illustrates a differential comparator device 70 employed in high speed ADC designs utilizing devices operating within specific voltage ranges. The comparator device 70 includes a 1.2 Volt pre-amplifier device 72 with a negative input terminal, a positive input terminal, a positive output terminal and a negative output terminal. The pre-amplifier 72 is designed to provide high speed data conversion (e.g., 1.28 GSample/s). The 1.2 Volt CMOS device used in the pre-amplifier can only withstand voltages of about 1.2 volts and, therefore, the pre-amplifier is powered by a supply voltage of 1.2 volts. A first feedback loop 75 couples the negative input terminal to the positive output terminal of the pre-amplifier 72 and a second feedback loop 77 couples the positive input terminal to the negative output terminal of the pre-amplifier 72.

A first capacitor 86 is coupled to a pair of switches 80 and 82 on a left side, and to the negative input terminal of the pre-amplifier 72 on a right side through a first n-type source follower device 94. A second capacitor 92 is coupled to a pair of switches 88 and 90 on a left side, and to the positive input terminal of the pre-amplifier 72 on a right side through a second n-type source follower 96. The first and second n-type source followers 94 and 96 employ 3.3 volt devices, and are selected to assure that there is substantially no gate-to-source leakage that would cause voltage loss from the first capacitor 86 and the second capacitor 92 after an auto-zero cycle. The 3.3 volt device used in the n-type source followers of the present invention do not exhibit leakage because of a substantially thick oxide layer between the gate and the channel of the source followers, wherein 1.2 volt devices do exhibit some gate-to-source and gate-to-drain current leakage because of their relatively thin oxide layers.

It is to be appreciated that a 3.3 volt device will have a relatively large size (e.g., a minimum channel length of about 0.5 micron) compared to the size (e.g., a minimum channel length of about 0.15 micron) of a 1.2 volt device. The 1.2 volt device is much faster than the 3.3 volt device. For very high-speed operation, in accordance with one exemplary aspect of the present invention, 1.2 volt devices are used as the input transistors in the pre-amplifier 72, but 1.2 volt devices demonstrate gate current leakage. The source followers 94 and 96 are added to prevent the pre-charge on the capacitors 86 and 92 from leaking away and meanwhile ensure high speed operation of the comparators.

The switch 80 is coupled to a first voltage input signal ($V_{IN+}$) and the switch 88 is coupled to a second voltage input signal ($V_{IN-}$). The switch 82 is coupled to a first voltage reference signal ($V_{REF+}$) and the switch 90 is coupled to a second voltage reference signal ($V_{REF-}$). The pre-amplifier 72 is followed by a latch device 74, which provides a digital output of the sampled analog output difference signal of the pre-amplifier 72.

The first and the second n-type source followers 94 and 96, as well as switches 76 and 78, employ 3.3 volt devices so that the voltage ($V_{REF}+V_{OFFSET}$) stored at the capacitors 86 and 92, during the auto-zero cycle, do not leak appreciably during the conversion cycle. However, because of the use of 3.3 volt n-type source followers, there is a DC-voltage shift between the input and the output of both of the n-type source followers 94 and 96. A first 3.3 volt p-type source follower 98 is placed in the first feedback loop 75 and a second 3.3 volt p-type source follower 100 is placed in the second feedback loop 77 to compensate for any DC-voltage shift in the first and second n-type source followers 94 and 96. For proper swing operation, both input and output common-mode signals of the pre-amplifier 72 are set at about 0.6 volts (VDD/2) for rail-to-rail swing. Since the threshold voltage ($V_T$) of a 3.3 volt n-type device used in the source follower device is about 0.8 volts and the common mode signal into the pre-amplifier 72 is about 0.6 volts, the common-mode voltage at the inputs of the first source follower 94 and the second source follower 96 should be about 1.4 volts. However, the pre-amplifier 72 is operable under a 1.2 volt supply for device safety considerations. The first and second p-type source followers 98 and 100 allow for setting the common-mode voltage at the inputs of the n-type source followers 94 and 96 to 1.4 volts during the auto-zero cycle to compensate for the DC level shift of the n-type source followers 94 and 96. The p-type source followers 98 and 100 can be switched off during the conversion cycle to save power. Furthermore, switches 102 and 104 are opened during the conversion cycle to reduce the output capacitance of the pre-amplifier 72.

During an auto-zero cycle, the reference voltage $V_{REF+}$ and $V_{REF-}$ are connected to the left side of the capacitors 86 and 92, respectively, while the feedback loops 75 and 77 are connected around the pre-amplifier 72 by closing switches 82, 90, 76, 78, 102 and 104 and turning on source followers 94, 96, 98 and 100. As previously stated, the source followers 94 and 96 and the switches 76 and 78 are selected to have substantially no gate leakage current, so that the voltage stored on the capacitors 86 and 92 do not change during the conversion cycle. Since the switches 76, 78, 102 and 104 and the p-type source followers 98 and 100 are only used for switching the comparator device between the auto-zero cycle and the conversion cycle, they may be slower than the pre-amplifier 72 and still do not affect the speed of the pre-amplifier 72. Furthermore, since the gain of the n-type source followers 94 and 96 is small (e.g., approximately unity), speed of the n-type source followers 94 and 96 is not a factor that would reduce the speed of the comparator 70. Therefore, a differential comparator device is provided that is adapted for high speeds without any substantially problems due to leakage current.

During the conversion cycles, the feedback loops 75 and 77 around the pre-amplifier 72 are opened via switches 76, 102, 78 and 104, and the p-type source followers 98 and 100 are turned off. The left side of the capacitors 86 and 92 are connected to the comparator input ($V_{IN+}$, $V_{IN-}$) instead of the reference signals ($V_{REF+}$, $V_{REF-}$). The input nodes of the pre-amplifier 72 receive the input signals subtracted by the reference voltages through the first and the second source followers 94 and 96. The input signal of the pre-amplifier 72 is then amplified and the output of the pre-amplifier 72 is fed to the latch 74. During the conversion cycle, the latch 74 provides a series of digital output words corresponding to the analog output signal of the pre-amplifier 72.

Figure 5:
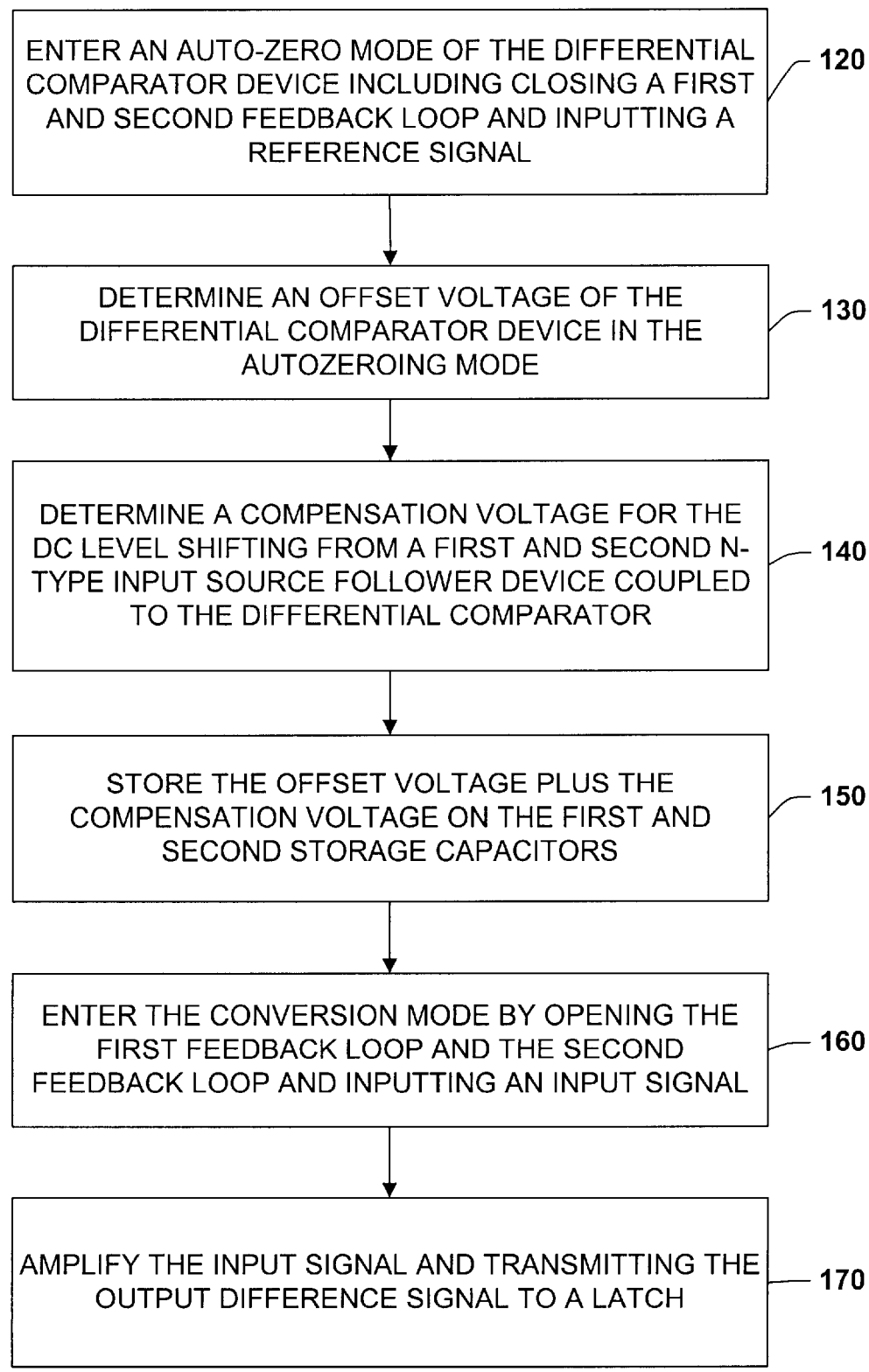
FIG. 5 illustrates a flow chart of one particular methodology of amplifying a differential input to a comparator circuit in accordance with one aspect of the present invention.

FIG. 5 is a flow diagram representing an auto-zero and conversion methodology of a high-speed differential comparator device similar to the device illustrated in FIG. 4. While, for purposes of simplicity of explanation, the methodology of FIG. 5 is shown and described as a series of steps, it is to be understood and appreciated that the present invention is not limited to the order of steps, as some steps may, in accordance with the present invention, occur in different orders and/or concurrently with other steps from that shown and described herein. For example, a methodology in accordance with an aspect of the present invention may be represented as a combination of various states (e.g., in a state diagram). Moreover, not all illustrated steps may be required to implement a methodology in accordance with an aspect the present invention.

FIG. 5 is a flow diagram illustrating one particular methodology of auto-zero and conversion of a differential signal provided to a differential comparator circuit utilizing an input offset storage routine. The differential comparator circuit employs substantially non-leaking n-type source followers coupled to inputs of a pre-amplifier. At step 120, an auto-zero mode for the differential comparator device is entered, which includes closing a first and second feedback loop and inputting a reference signal. For example, if the differential comparator device of FIG. 4 is being utilized, the switches 76, 102, 78 and 104 are closed, while the source followers 98, 100, 94 and 96 are turned on. The reference signal is provided by closing the switches 82 and 90. At step 130, an offset voltage is determined for the differential comparator device while in the auto-zero mode. If a pre-amplifier device is being employed the offset voltage is determined, so that it can be considered during differential mode operation of the pre-amplifier device.

At step 140, a compensation voltage is determined for a DC level shifting caused by the first and second source follower device coupled to the inputs of the differential comparator. If the circuit of FIG. 4 is being employed, the compensation voltage is automatically provided to the storage capacitors by the p-type source follower devices 98 and 100. However, other methodologies may be employed such as utilizing other hardware and/or software to determine and provide the necessary voltage to compensate for the DC level shift caused by the n-type source followers. At step 150, the reference and the offset voltage plus the compensation voltage is stored on the first and the second storage capacitors.

The differential comparator device then enters the conversion mode by opening the first and second feedback loops and providing an input signal into the differential comparator device through the first and second capacitors, at step 160. For example, opening the first feedback loop 75 of the device of FIG. 4 includes opening the switches 76 and 102 and turning off the p-type source follower 98 to save power. Additionally, opening the second feedback loop 77 includes opening the switches 78 and 104 and turning off the p-type source follower 100 to save power. The input signal is provided by closing the switches 80 and 88 and opening the switches 82 and 90. At step 170, the input signal is amplified and the output difference signal is transmitted to the latch for providing a series of digital words corresponding to the analog difference signal.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A differential comparator device for a high-speed analog-to-digital converter, the differential comparator device being configured to be auto-zeroed employing an input offset storage technique, the device comprising:

a pre-amplifier having a first input and a second input, and a first output and a second output;

a first storage capacitor and a second storage capacitor operable to store a reference voltage and an offset voltage of the pre-amplifier during an auto-zero mode;

a first buffer component coupled to the first input of the pre-amplifier and the first storage capacitor and a second buffer component coupled to the second input of the pre-amplifier and the second storage capacitor, the first and the second buffer components preventing substantial leakage of the first and second storage capacitors;

a first feedback loop coupling the first output of the pre-amplifier to the first input of the pre-amplifier through the first buffer and a second feedback loop coupling the second input of the pre-amplifier to the second output of the pre-amplifier through the second buffer;

a first switch located in the first feedback loop having a first state for closing the first feedback loop and a second state for opening the feedback loop and a second switch located in the second feedback loop having a first state for closing the first feedback loop and a second state for opening the feedback loop, the first and the second switches are chosen to prevent a leakage of the first and second storage capacitors;

wherein the differential comparator device comprises an auto-zero mode, such that the first and second feedback loops are closed and a reference voltage is provided to the first and the second storage capacitor and the offset voltage of the pre-amplifier device is determined and stored on the first and second storage capacitors, and the differential comparator device comprises a conversion mode, such that the first and second feedback loops are opened and an input voltage is provided to the first and the second storage capacitors and the offset voltage of the pre-amplifier is utilized in determining a differential difference signal corresponding to the input voltage eliminating errors due to the offset voltage of the pre-amplifier.

2. The device of claim 1, the first and second buffer devices being a first and a second n-type source follower device.

3. The device of claim 1, the pre-amplifier comprising a high-speed device.

4. The device of claim 3, wherein the high-speed device comprises a 1.2 volt MOS transistor device.

5. The device of claim 2, the first and second n-type source follower devices comprise low-speed devices.

6. The device of claim 5, wherein each n-type source follower device comprises a 3.3 volt MOS transistor device coupled to a current source.

7. The device of claim 1, the first and second switches comprise 3.3 volt MOS transistor devices.

8. The device of claim 1, further comprising a first compensating device disposed in the first feedback loop operable to compensate a DC level shift caused by the first n-type source follower device and a second compensating device disposed in the second feedback loop operable to compensate a DC level shift caused by the second n-type source follower device.

9. The device of claim 8, the first and second compensating devices further comprising first and second p-type source follower circuits comprising 3.3 volt p-type MOS transistor devices, respectively.

10. The device of claim 9, the first and second p-type MOS transistor devices in the p-type source follower circuits operable to turn off during the conversion mode to reduce power consumption of the device.

11. The device of claim 10, further comprising a third switch disposed in the first feedback loop between the first p-type source follower circuit and the first output of the pre-amplifier device and a fourth switch disposed in the second feedback loop between the second p-type source follower circuit and the second output of the pre-amplifier device.

12. The device of claim 11, the third switch and the fourth switch being operable to open in the conversion mode reducing a capacitive load on the pre-amplifier device.

13. The device of claim 1, wherein the high-speed device is employed in the pre-amplifier to achieve high-speed analog-to-digital conversion despite device gate current leakage associated therewith.

14. A differential comparator device for a high speed analog-to-digital converter, the differential comparator device being configured to be auto-zeroed employing an input offset storage technique, the device comprising:

a 1.2 volt pre-amplifier comprising high-speed CMOS devices having a first and a second inputs and first and a second outputs;

a first storage capacitor and a second storage capacitor operable to store an offset voltage of the pre-amplifier and a reference voltage during an auto-zero mode;

a first 3.3 volt n-type source follower component coupled to the first input and the first storage capacitor and a second 3.3 volt n-type source follower component coupled to the second input and the second storage capacitor;

a first feedback loop coupling the first output of the pre-amplifier to the first input of the pre-amplifier through the first 3.3 volt n-type source follower component and a second feedback loop coupling the second input of the pre-amplifier to the second output of the pre-amplifier through the second 3.3 volt n-type source follower component;

a first 3.3 volt switch located in the first feedback loop having a first state for closing the first feedback loop and a second state for opening the first feedback loop and a second 3.3 volt switch located in the second feedback loop having a first state for closing the second feedback loop and a second state for opening the second feedback loop;

wherein the device has an auto-zero mode, such that the first and second feedback loops are closed and a reference voltage is provided to the first and the second storage capacitor and the offset voltage of the pre-amplifier is determined and stored on the first and second storage capacitors, and the device has a conversion mode, such that the first and second feedback loops are opened and an input voltage is provided to the first and the second storage capacitor and the offset voltage of the pre-amplifier is utilized in determining a differential difference signal corresponding to the input voltage eliminating errors due to the offset voltage of the 1.2 volt pre-amplifier.

15. The device of claim 14, further comprising a first compensating device disposed in the first feedback loop operable to compensate a DC level shift caused by the first 3.3 volt n-type source follower device and a second compensating device disposed in the second feedback loop operable to compensate a DC level shift caused by the second 3.3 volt n-type source follower device.

16. The device of claim 15, the first and second compensating devices each comprising 3.3 volt p-type source follower devices.

17. The device of claim 16, wherein the first and second p-type source follower devices are operable to turn off during the conversion mode to reduce power consumption of the device.

18. The device of claim 16, further comprising a third switch disposed in the first feedback loop between the first p-type source follower and the first output of the pre-amplifier and a fourth switch disposed in the second feedback loop between the second p-type source follower and the second output of the pre-amplifier.

19. The device of claim 18, the third switch and the fourth switch being operable to open in the conversion mode reducing the load of the pre-amplifier.

20. A method of employing an input offset storage technique for correcting an offset voltage of a pre-amplifier of a differential comparator device for a high speed analog-to-digital converter, the differential comparator device having first and second storage capacitors coupled to respective differential inputs of the pre-amplifier through first and second n-type source followers, and first and second feedback loops having first and second switches for opening and closing the first and second feedback loops, the method comprising:

closing the first and second feedback loops and inputting two reference signals into the first and second storage capacitor;

determining an offset voltage;

determining a compensation voltage to compensate for the DC level shifting of the first and second n-type source followers;

storing the offset voltage plus the compensation voltage on the first and second storage capacitors;

opening the first and second feedback loops and inputting a signal into the first and second storage capacitor; and amplifying the input signal and transmitting the output difference signal to a latch.

21. The method of claim 20, the pre-amplifier employing high-speed devices to achieve extremely high-speed analogto-digital conversion despite device gate current leakage associated therewith.

22. The method of claim 21, wherein the high-speed device comprises a 1.2 volt MOS transistor device.

23. The method of claim 20, the first and second n-type source follower devices comprising 3.3 volt MOS transistor devices.

24. The method of claim 20, the first and second switches comprising 3.3 volt MOS transistor devices.

25. The method of claim 20, the step of determining a compensation voltage to compensate for the DC level shifting comprising providing a first 3.3 volt p-type source follower device in the first feedback loop and providing a second 3.3 volt p-type source follower device in the second feedback loop.

26. The method of claim 20, further comprising decoupling the first p-type source follower device from the first output of the pre-amplifier and decoupling the second p-type source follower device from the second output signal of the pre-amplifier during the conversion mode to reduce an output capacitive load of the pre-amplifier.

* * * * *